(12) United States Patent
Li et al.

(10) Patent No.: US 9,445,506 B2
(45) Date of Patent: Sep. 13, 2016

(54) PREPARATION METHOD OF PATTERNED FILM, DISPLAY SUBSTRATE AND DISPLAY DEVICE

(71) Applicant: BOE TECHNOLOGY GROUP CO., LTD., Beijing (CN)

(72) Inventors: Lin Li, Beijing (CN); Chen Tang, Beijing (CN); Yangyang Xin, Beijing (CN); Shan Chang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/527,134

(22) Filed: Oct. 29, 2014

(65) Prior Publication Data

US 2015/0382475 A1 Dec. 31, 2015

(30) Foreign Application Priority Data

Jun. 30, 2014 (CN) .......................... 2014 1 0306505

(51) Int. Cl.
*H05K 3/06* (2006.01)
*H05K 1/09* (2006.01)

(52) U.S. Cl.
CPC .............. *H05K 3/062* (2013.01); *H05K 1/097* (2013.01); *H05K 3/064* (2013.01); *H05K 2201/0108* (2013.01); *H05K 2201/026* (2013.01); *H05K 2201/10128* (2013.01); *H05K 2203/0574* (2013.01)

(58) Field of Classification Search
None
See application file for complete search history.

(56) References Cited

U.S. PATENT DOCUMENTS

| 2004/0135941 | A1 | 7/2004 | Nam et al. | |
|---|---|---|---|---|
| 2005/0047100 | A1 | 3/2005 | Kim | |
| 2011/0253668 | A1* | 10/2011 | Winoto et al. | 216/13 |
| 2013/0078436 | A1* | 3/2013 | Naito et al. | 977/762 |
| 2014/0104511 | A1* | 4/2014 | Liu et al. | 216/13 |
| 2014/0186989 | A1* | 7/2014 | Komai | H01L 31/05 438/66 |
| 2014/0202738 | A1* | 7/2014 | Allemand et al. | 977/932 |
| 2014/0290979 | A1* | 10/2014 | Joo et al. | 216/13 |

FOREIGN PATENT DOCUMENTS

| CN | 1319834 | 10/2001 |
|---|---|---|
| CN | 102622126 | 8/2012 |
| CN | 103732798 | 4/2014 |

OTHER PUBLICATIONS

Chinese Office Action with English Language Translation, dated Apr. 25, 2016, Chinese Application No. 201410306505.0.

* cited by examiner

*Primary Examiner* — Michelle Mandala
(74) *Attorney, Agent, or Firm* — Blakely Sokoloff Taylor & Zafman LLP

(57) ABSTRACT

Embodiments of the present invention provide a preparation method of a patterned film, a display substrate and a display device, avoiding falling off of a film layer occurring in the process of peeling off a photoresist layer. The preparation method of the patterned film comprises: forming a preset film layer on a surface of a preset substrate; covering the preset film layer with an isolation layer; forming a photoresist layer on a surface of the isolation layer and forming a pattern of the isolation layer with a patterning process; then removing the preset film layer which is not covered by the pattern of the isolation layer, peeling off the photoresist layer and removing the remaining, isolation layer to form a pattern of the preset film layer.

8 Claims, 2 Drawing Sheets

… (1)

PREPARATION METHOD OF PATTERNED FILM, DISPLAY SUBSTRATE AND DISPLAY DEVICE

RELATED APPLICATIONS

The present application claims the benefit of Chinese Patent Application No. 201410306505.0, filed Jun. 30, 2014, the entire disclosure of which is incorporated herein by reference.

FIELD OF THE INVENTION

The present invention relates to display field, in particular to a preparation method of a patterned film, a display substrate and a display device.

BACKGROUND OF THE INVENTION

The transparent conductive film is a conductive film which can be coated on a surface of a substrate with high transmittance. The film has excellent optical transparency and surface conductivity, and is widely used in display field.

In the transparent conductive film, an indium tin oxide (referred to as ITO) film which has excellent optical transparency and conductivity, becomes a material which is most widely used. However, there is an urgent need for alternative materials due to indium being rare metal, a lack of resources, toxic indium oxides, and environmental protection. Currently, conductive polymers, carbon nanotubes silver nanowires, and metal nanowires, etc. are materials expected to be used to replace ITO. In comparison, the silver nanowires in the metal nanowires get a lot of attention and research due to the excellent chemical properties stability and excellent electrical conductivity of metallic silver.

In the prior art, generally a semiconductor process technology is used to achieve a pattern of a silver nanowire. Specifically, photoresist can be coated on a surface of the formed silver nanowire film layer, and then the silver nanowire pattern can be obtained by exposing, developing, and etching or other patterning process. However, since the silver nanowire film is relatively thin, falling off of the silver nanowire film or residual of photoresist on the silver nanowires may occur when peeling off by using the current conventional photoresist, thus seriously affecting the quality of products. Moreover, developing specific photoresist materials and processes for the silver nanowire film will increase costs and increase difficult in mass production.

SUMMARY OF THE INVENTION

Embodiments of the present invention provide a preparation method of a patterned film, a display substrate and a display device, avoiding falling off of a film layer occurring in the process of peeling off a photoresist layer.

In order to achieve the above purpose, embodiments of the present invention employ the following technical solution:

In one aspect, embodiments of the present invention provide a preparation method of a patterned film, comprising:

forming a preset film layer on a surface of a preset substrate;

forming an isolation layer on a surface of the preset film layer;

forming a photoresist layer on a surface of the isolation layer and forming a pattern of the isolation layer with a patterning process;

removing the preset film layer which is not covered by the pattern of the isolation layer; and peeling off the photoresist layer, removing the pattern of the isolation layer to form a pattern of the preset film layer.

In another aspect, embodiments of the present invention provide a display substrate, comprising a transparent substrate and a pattern of a preset film layer located on a surface of the transparent substrate, the pattern of the preset film layer is manufactured by the preparation method of the patterned film as recited above.

In still another aspect, embodiments of the present invention provide a display device comprising the display substrate described above.

Embodiments of the present invention provide a preparation method of a patterned film, a display substrate and a display device. The preparation method of the patterned film comprises: forming a preset film layer on a surface of a preset substrate; covering the preset film layer with an isolation layer; forming a photoresist layer on a surface of the isolation layer and forming a pattern of the isolation layer with a patterning process; then removing the preset film layer which is not covered by the pattern of the isolation layer, peeling off the photoresist layer and removing the remaining isolation layer to form a pattern of the preset film layer. Thus, the photoresist layer has not to directly contact the preset film layer. It is possible to avoid the falling off of the preset film layer when peeling off the photoresist layer, thereby improving the product quality and the product percent of pass.

BRIEF DESCRIPTION OF THE DRAWINGS

In order to illustrate the embodiments of the present invention or the technical solutions in the related art more clearly, figures for the description of the embodiments or in the related art will be introduced briefly. Obviously, the drawings in the following description is merely some embodiments of the present invention, for one of ordinary skill in the art, other figures can be obtained based on these figures without creative efforts.

DETAILED DESCRIPTION OF THE INVENTION

Figure 1:
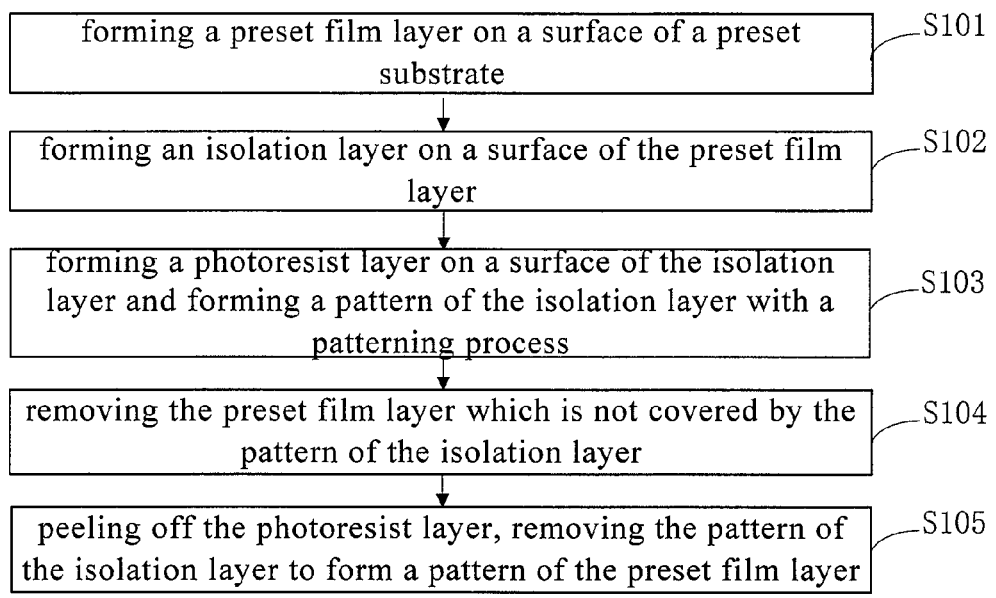
FIG. 1 is a schematic flow chart of a preparation method of a patterned film provided by an embodiment of the present invention.

Technical solutions in the embodiments of the present invention will be clearly and completely described below, by referring to the drawings in the embodiments of the present invention. Obviously, the described embodiments are merely part of the embodiments of the present invention, but not all embodiments. Based on the embodiments of the present invention, all other embodiments obtained by one of ordinary skill in the art without creative efforts, all belong to the protection scope of the present invention.

Figure 2A:
FIG. 2a-FIG. 2g are schematic structural views of each step in the preparation process of a patterned film provided by an embodiment of the present invention.

Embodiments of the present invention provide a preparation method of a patterned film, as shown in FIG. 1, comprising:

S101: as shown in FIG. 2a, a preset film layer 11 is formed on a surface of a preset substrate 10.

It should be noted that the surface of the preset substrate 10 may be a surface of a transparent substrate, or may be the surface of the uppermost film layer in a plurality of film layers formed with a stacked structure on the transparent substrate. Wherein the transparent substrate may be a transparent glass substrate or a transparent resin substrate, which is not limited in the present invention.

Figure 2B:
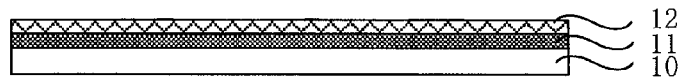

S102: as shown in FIG. 2b, an isolation layer 12 is formed on a surface of the preset film layer 11.

Specifically, the isolation layer 12 can be formed by coating, spraying, etc. after the step S101.

Figure 2C:
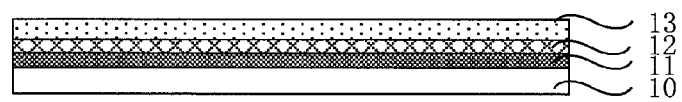
Figure 2D:
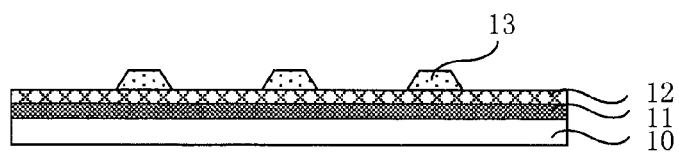
Figure 2E:
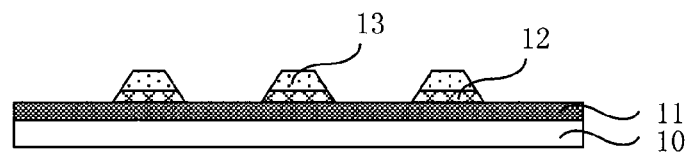

S103: as shown in FIG. 2c, a photoresist layer 13 is formed on a surface of the isolation layer 12 and as shown in FIG. 2d and FIG. 2e, a pattern of the isolation layer 12 is formed with a patterning process.

Specifically, the photoresist layer 13 can be formed by coating, spraying or other process; and, a mask is employed on the surface of the photoresist layer 13 to form a pattern of the photoresist layer 13 with a mask developing process; then the isolation layer 12 which is not covered by the photoresist layer 13 is etched to form the pattern of the isolation layer 12.

Figure 2F:
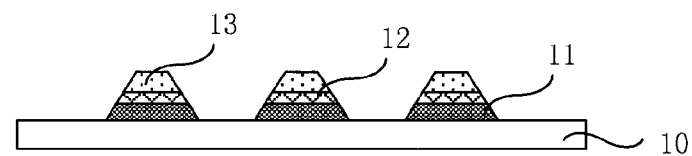

S104: as shown in FIG. 2f, the preset film layer 11 which is not covered by the pattern of the isolation layer 12 is removed.

Figure 2G:
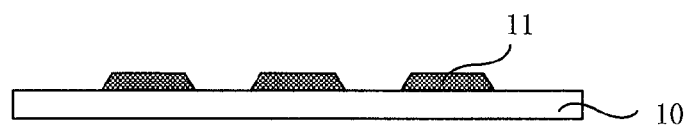

S105: as shown in FIG. 2g, the photoresist layer 13 is peeled off, the pattern of the isolation layer 12 is removed, to form a pattern of the preset film layer 11.

It should be noted that, in the present invention, the patterning process can comprise a photolithography process, or comprise a photolithography process and a etching step, it may also comprise printing, ink-jetting and other processes for forming a predetermined pattern; the photolithography process refers to a process which forms a pattern with photoresist, mask plate and exposure machine, etc., comprising film-forming, exposing, developing and other process. Corresponding patterning process can be selected according to the structures formed in the present invention.

Embodiments of the present invention provide a preparation method of patterned film. The preparation method of the patterned film comprises: forming a preset film layer on a surface of a preset substrate; covering the preset film layer with an isolation layer; forming a photoresist layer on a surface of the isolation layer and forming a pattern of the isolation layer with a patterning process; then removing the preset film layer which is not covered by the pattern of the isolation layer, peeling off the photoresist layer and removing the remaining isolation layer to form a pattern of the preset film layer. Thus, the photoresist layer has not to directly contact the preset film layer. It is possible to avoid the fall of phenomenon of the preset film layer when peeling off the photoresist layer, thereby improving the product quality and the product percent of pass.

Further, the material constituting the preset film layer 11 may be silver nanowire.

It should be noted that the silver nanowire belongs to one kind of metallic nanowires. In addition to excellent conductivity, the silver nanowire also has excellent transparency and flexibility due to size effect of nanoscale. Therefore, the silver nanowire is considered to be the material most likely alternative to conventional ITO transparent electrode, and provides a possibility of achieving environmental protection, flexible, bendable LED display, touch screen, etc., and it has been applied to the film solar cell in a lot of researches. In addition, due to the large length/diameter ratio effect of the silver nanowire, the silver nanowire also has outstanding advantages in the applications of conductive adhesive, thermal conductive adhesive and other aspects.

Further, the step of removing the pattern of the isolation layer 12 may comprise wet etching.

It should be noted that, in the conventional film machining process, removing a film layer generally adopts an etching process. The etching process comprises dry etching and wet etching. Among them, dry etching is a film etching technique using plasma to perform film etching; wet etching is a technique which immerses the materials to be etched in an etching liquid for chemical etching. In comparison, the application scope of wet etching is relatively wide and relatively economical. Therefore, it is helpful for reducing the production cost.

Further, when using wet etching, the material constituting the isolation layer 12 may comprise a metal material with a metal activity greater than the that of metallic silver.

It should be noted that, the metal activity may refers to the metal activity degree of the metal in chemistry reaction. Thus, in the process of removing the isolation layer 12 by wet etching, since the metal activity of the metallic silver nanowire is smaller than the metal activity of the material constituting the isolation layer 12, in the process of etching the isolation layer 12 with etching solution, silver nanowire covered by the isolation layer 12 will not be destructed, thus the integrity of the pattern of the preset film layer 11 constituted by the silver nanowires can be insured, in turn improving the product quality and reducing rejection rate.

Further, when a metal material with a metal activity greater than the silver is applied for the isolation layer 12, the isolation layer 12 may be made of metallic copper or metallic aluminum. Preparation of metallic aluminum and metallic copper is relatively simple; in display field, the above two materials are more widely used with mature technology. Therefore, to those skilled in the art, using metallic copper or metallic aluminum to constitute the isolation layer 12, makes it possible to reduce the technical difficulty of the staff, thus improving the production efficiency.

Further, the thickness of the isolation layer 12 may range from 2000 angstroms to 5000 angstroms.

It should be noted that, on one hand, during the manufacturing process of the isolation layer 12, when the thickness of the isolation layer 12 is relatively thin, e.g. less than 2000 angstroms, it is difficult to make the isolation layer 12 completely formed with the existing preparation process, e.g. coating, spraying, etc. On the other hand, when the thickness of the formed isolation layer 12 is relatively thick, e.g., greater than 5000 angstroms, in the process of removing the isolation layer 12 with wet etching process, the isolation layer 12 can not be completely etched off by the etching liquid, resulting in residual of a part of the isolation layer 12, thus influencing the product quality and performance.

Embodiments of the present invention provide a display substrate, the display substrate may comprise a transparent substrate 10 and a pattern of a preset film layer 11 located on a surface of the transparent substrate 11. Wherein the pattern of the preset film layer 11 may be prepared using any of preparation methods of patterned film as described above.

Embodiments of the present invention provide a display substrate, the display substrate comprises a transparent substrate and a preset film layer located on a surface of the transparent substrate. Wherein, the preset film layer is made by the preparation method of the patterned film as described above. The preparation method of the patterned film comprises: forming a preset film layer on a surface of a preset substrate; covering the preset film layer with an isolation layer; forming a photoresist layer on a surface of the isolation layer and forming a pattern of the isolation layer with a patterning process; then removing the preset film layer which is not covered by the pattern of the isolation layer, peeling off the photoresist layer and removing the remaining isolation layer to form a pattern of the preset film layer. Thus, the photoresist layer has not to directly contact the preset film layer. It is possible to avoid falling off of the preset film layer when peeling off the photoresist layer, thereby improving the product quality and the product percent of pass.

Figure 3:
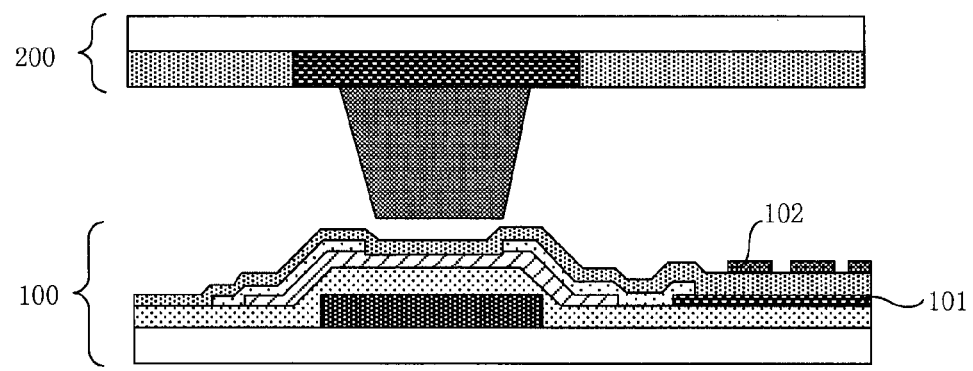
FIG. 3 is a schematic structural view of a display device provided by an embodiment of the present invention.

In the embodiments of the present invention, the display substrate described above may be a substrate in the TFT-LCD (Thin Film Transistor-Liquid Crystal Displays) or a substrate in the OLED (organic light emitting diode) displays. Taking the TFT-LCD as an example, as shown in FIG. 3, TFT-LCD consists of an array substrate 100 and a color filter substrate 200. Specifically, liquid crystal (not shown) is filled into the array substrate 100 and the color filter substrate 200; by controlling the deflection of the liquid crystal, the control on light intensity can be achieved, and the color image displaying can be achieved with filtering effect of the color filter substrate.

Further, the material constituting the preset film layer 11 may be silver nanowire.

It should be noted that the silver nanowire belongs to one kind of metallic nanowires. In addition to excellent conductivity, the silver nanowire also has excellent transparency and flexibility due to size effect of nanoscale. Therefore, the silver nanowire is considered to be the material most likely alternative to conventional ITO transparent electrode, and provides a possibility of achieving environmental protection, flexible, bendable LED display, touch screen, etc.

Further, the display substrate may comprise a pixel electrode 101 and/or a common electrode 102. Wherein, the pixel electrode 101 and/or the common electrode 102 may be constituted by the pattern of the preset film layer 11. Thus, silver nanowires can be used to form the pixel electrode 101 and/or common electrode 102, thereby be capable of replacing the use of ITO used in the display art, avoiding contamination to the environment during the process of applying ITO, and can reduce the production cost.

In another aspect of the present invention, a display device is provided, comprising any one of the display substrates described above. It has the same advantageous effects as the display substrate provided in the above embodiments, since the detailed structure of the display substrate have been described in detail in the above embodiments, it will not be described here.

The display device provided by the embodiments of the invention specifically may be a liquid crystal display device, an organic electroluminescent display device, or an electrophoretic display device, etc.; e.g. the display device may be an LCD, an LCD TV, a digital photo frame, a mobile phone, a tablet PC or any products or components which have display function.

Embodiments of the present invention provide a display device, the display device comprises a display substrate, the display substrate comprises a transparent substrate and a preset film layer located on a surface of the transparent substrate. Wherein, the preset film layer is made by the preparation method of the patterned film described above. The preparation method of the patterned film comprises: forming a preset film layer on a surface of a preset substrate; covering the preset film layer with an isolation layer; forming a photoresist layer on a surface of the isolation layer and forming a pattern of the isolation layer with a patterning process; then removing the preset film layer which is not covered by the pattern of the isolation layer, peeling off the photoresist layer and removing the remaining isolation layer to form a pattern of the preset film layer. Thus, the photoresist layer has not to directly contact the preset film layer. It is possible to avoid falling off of the preset film layer when peeling off the photoresist layer, thereby improving the product quality and the product percent of pass.

It should be noted that, the pixel electrode 101 and the common electrode 102 formed by silver nanowire can be simultaneously fabricated on the array substrate 100 to form AD-SDS (Advanced-Super Dimensional Switching, referred to as ADS) type display device (as shown in FIG. 3). A pixel electrode 101 formed by silver nanowires can also be fabricated on the array substrate 100, and the common electrode 102 formed by silver nanowires can be fabricated on the color film substrate 200, to form a TN (Twist Nematic) type and other display devices.

Specifically, TN type display device drives the liquid crystal under the twisted nematic mode with a vertical electric field formed between the common electrodes 102 disposed on the color filter substrate 200 and a pixel electrode 101 on the array substrate 100. While the vertical electric field LCD has the advantage of a large aperture ratio, it has the disadvantage of a narrow visual angle of about 90°; ADS-type display device forms a multidimensional electric field through a electric field occurred by the edges of the common electrodes 102 with a slit shape fabricated in the same plane and an electric field between the slit-shaped common electrodes and the pixel electrodes 101 with a plate shape, which makes the liquid crystal molecules with all orientations between the slit-shaped electrodes in the liquid crystal box and above the electrodes, thereby improving the liquid crystal work efficiency and improving the light transmittance. Thus, ADS-type display device has advantage of a wide visual angle of approximately 160°, in addition, ADS-type display device may further improve the picture quality of TFT-LCD product, which has advantages such as high resolution, high transmittance, low power consumption, wide visual angle, high aperture ratio, low chromatic aberration, free of push mura, etc.

The above content is only embodiments of the present invention, the scope of protection of the present invention is not limited to this; any variations or replacements that can be easily thought by those skilled in the art should be covered within the protection scope of the present invention. Accordingly, the protection scope of the invention should be in line with the scope of the claims.

The invention claimed is:

1. A preparation method of a patterned film, wherein the method comprises:
   forming a preset film layer on a surface of a preset substrate, the material constituting the preset film layer being silver nanowire;
   forming an isolation layer on a surface of the preset film layer;
   forming a photoresist layer on a surface of the isolation layer and forming a pattern of the isolation layer with a patterning process;
   removing the preset film layer which is not covered by the pattern of the isolation layer; and
   peeling off the photoresist layer, removing the pattern of the isolation layer to form a pattern of the preset film layer.

2. The preparation method of a patterned film according to claim 1, wherein the step of removing the pattern of the isolation layer comprises wet etching.

3. The preparation method of a patterned film according to claim 2, wherein the material constituting the isolation layer comprises a material of which the metal reactivity is greater than that of metallic silver.

4. The preparation method of a patterned film according to claim 3, wherein the isolation layer consists of metallic copper or metallic aluminum.

5. The preparation method of a patterned film according to claim 4, wherein the thickness of the isolation layer ranges from 2000 angstrom to 5000 angstrom.

6. A display substrate, wherein the display substrate comprises a transparent substrate and a pattern of a preset film layer located on a surface of the transparent substrate, the pattern of the preset film layer is manufactured by the preparation method of a patterned film according to claim 1.

7. The display substrate according claim 6, wherein the display substrate further comprises a pixel electrode and/or a common electrode; the pixel electrode and/or the common electrode consists of the pattern of the preset film layer.

8. A display device, wherein the display device comprises the display substrate according to claim 6.

* * * * *